United States Patent [19]

Cappon et al.

[11] 4,223,233
[45] Sep. 16, 1980

[54] CHARGE TRANSFER DEVICE INPUT CIRCUITRY

[75] Inventors: Arthur M. Cappon, Boston; Jay P. Sage, Newton, both of Mass.

[73] Assignee: Raytheon Company, Lexington, Mass.

[21] Appl. No.: 800,829

[22] Filed: May 26, 1977

[51] Int. Cl.$^2$ .................. H03K 21/00; H03K 23/08; H03K 25/00
[52] U.S. Cl. .................. 307/221 D; 333/165; 343/17.1 R; 357/24
[58] Field of Search .................. 307/221 D; 343/7.7, 343/17.7; 333/70 T, 165; 357/24

[56] References Cited

U.S. PATENT DOCUMENTS

| | | | |
|---|---|---|---|
| 3,942,034 | 3/1976 | Buss | 307/221 D |
| 3,950,750 | 4/1976 | Churchill et al. | 343/17.7 |
| 4,016,567 | 4/1977 | Buss | 343/7.7 |
| 4,032,867 | 6/1977 | Engeler et al. | 307/221 D |
| 4,035,629 | 7/1977 | Lampe et al. | 307/221 D |

OTHER PUBLICATIONS

C. H. Sequin et al., "Charge Transfer Devices," Bell Telephone Laboratories, 1975.
R. D. Baertsch et al., IEEE Journal, Solid-State Circuits, Feb. 1976, vol. SC-11, No. 1, pp. 64–74.
J. B. G. Roberts et al., IEEE Journal, Solid-State Circuits, Feb. 1976, vol. SC-11, No. 1, pp. 100–104.

*Primary Examiner*—Stephen C. Buczinski
*Attorney, Agent, or Firm*—Richard M. Sharkansky; Joseph D. Pannone

[57] ABSTRACT

A charge transfer device having a source diffusion region, an isolation gate region, a reference voltage gate region and an input signal gate region disposed contiguously along such device, the isolation gate region being adapted for coupling to a pulse voltage source, the duration of such pulse being related to a predetermined sampling interval (and therefore related to the bandwidth of an input signal being sampled), the reference voltage gate region being adapted for coupling to a reference voltage source and the input signal gate region being adapted for coupling to the input signal. During each clock interval prior to the sampling interval the source diffusion region is pulsed, thereby enabling charge to pass from such region into the reference voltage gate region and the input gate region. During the sampling interval the potential energy level of the isolation gate region is lowered to enable equilibration of the potential of the charge in the input gate region with the potential in the reference voltage source region, the charge in such input gate region thereby being proportional to the input signal level during the sampling interval. At the end of the sampling interval the potential energy level of the isolation gate region is raised to isolate the source diffusion region from the input gate region and thereby inhibit charge flow from the input gate region to the source diffusion region if the input signal level varies prior to the time at which the charge in the input gate region is transferred to the first storage stage of the device.

4 Claims, 34 Drawing Figures

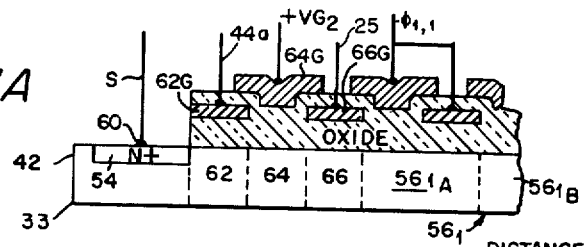
FIG. 4A
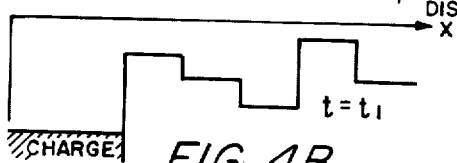
FIG. 4B
FIG. 4C
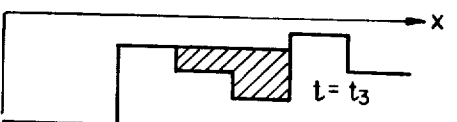
FIG. 4D
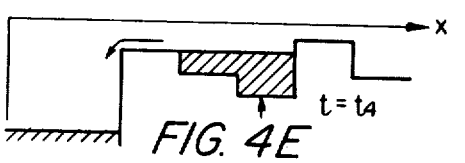
FIG. 4E
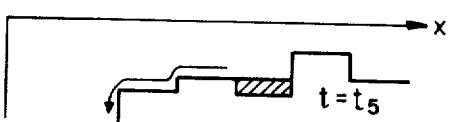
FIG. 4F
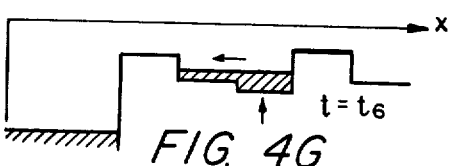
FIG. 4G
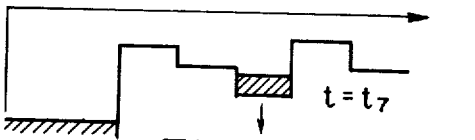
FIG. 4H
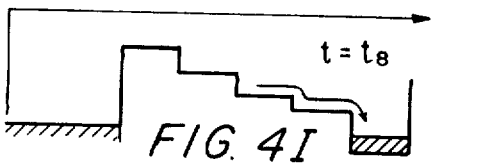
FIG. 4I
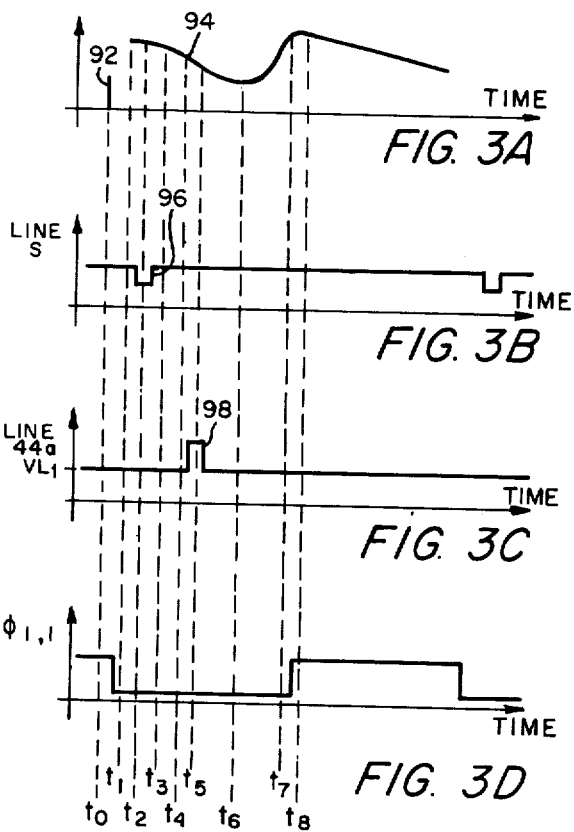
FIG. 3A
FIG. 3B
FIG. 3C
FIG. 3D

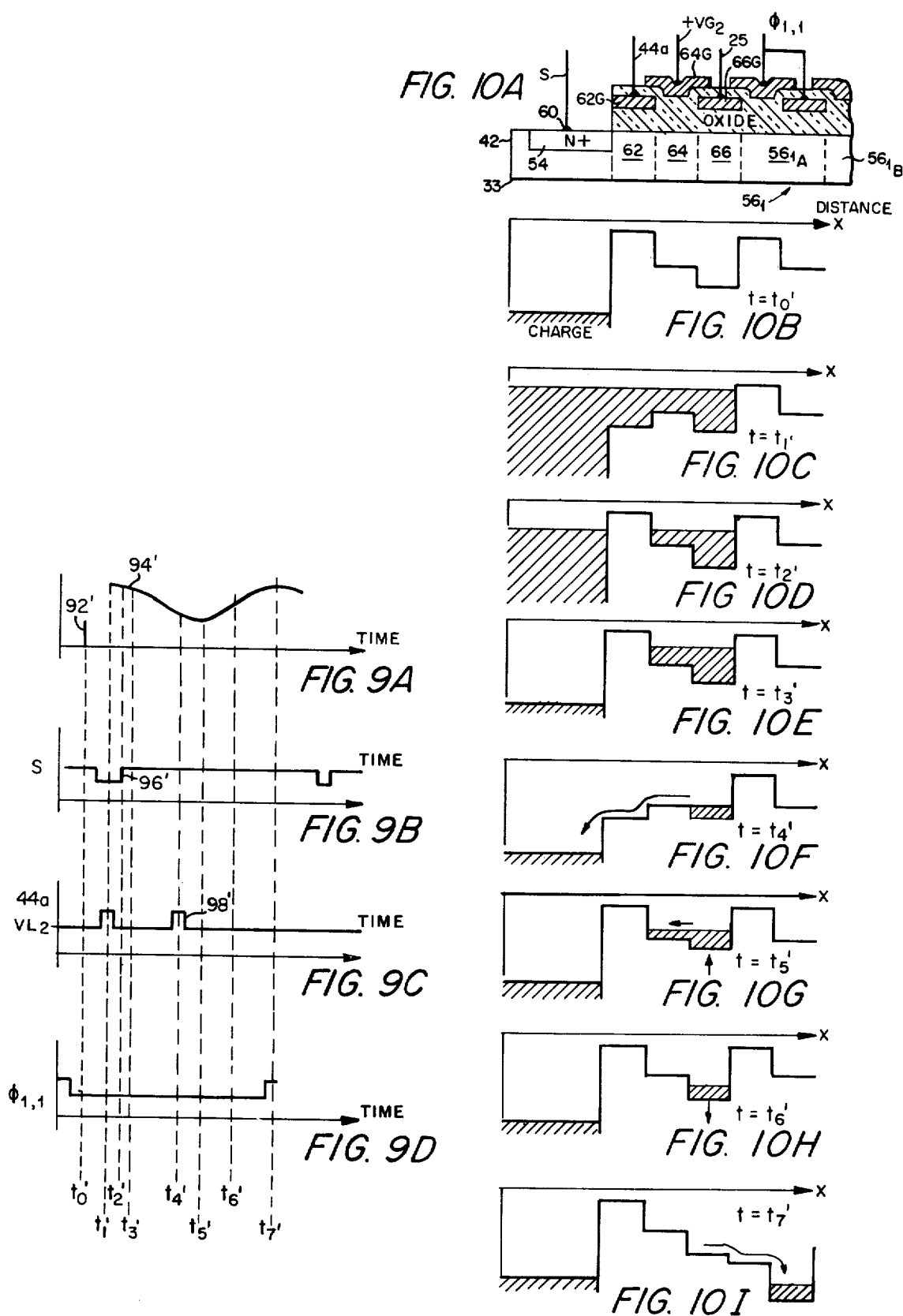

CHARGE TRANSFER DEVICE INPUT CIRCUITRY

BACKGROUND OF THE INVENTION

This invention relates generally to charge transfer devices and more particularly to input circuitry for such devices.

As is known in the art, radar system signal processors are used for determining the Doppler frequency associated with detected moving objects. In such radar system a bipolar video signal, or range sweep, is produced in response to each one of a train of pulses. The pulses are transmitted at the radar system pulse repetition frequency (PRF), typically in the order of several KHz. At predetermined times after each one of the pulses in the train is transmitted the bipolar video signal, or range sweep, is sampled. Each one of the samples corresponds to a radar return from an object at a corresponding range or range cell. The rate of change in sample level associated with any one range from range sweep to range sweep is indicative of the Doppler frequency of an object at such range cell. As is also known, the Doppler frequency of such object may be determined by passing the range sweep to range sweep samples associated with such object through a frequency spectrum analyzer. Signal processors of the type described have been implemented using various digital processing techniques; however, such processors generally require that the samples be converted into corresponding digital words, as with analog-to-digital converters, and then processed by suitable logic circuitry, thereby adding cost to the signal processor.

One technique which has been suggested to reduce the cost of such a radar system signal processor includes the use of a plurality of charge transfer devices. Each one of the charge transfer devices is associated with the samples of a corresponding one of a plurality of range cells. The samples produced from a plurality of range sweeps are stored in corresponding ones of the plurality of charge transfer devices. That is, the samples in each range sweep are stored, sequentially, into a corresponding one of the plurality of charge transfer devices and once stored are shifted from stage to stage each time a radar pulse is transmitted. That is, the stored samples are transferred from stage to stage at the radar system pulse repetition frequency (PRF), typically in the order of several KHz, as noted above. Once a predetermined number of samples is stored, such number being selected in accordance with the desired Doppler frequency resolution, the samples are passed for analysis to a frequency spectrum analyzer. With such arrangement it is noted the samples of a range sweep are taken in a sampling interval which is significantly shorter than the radar system pulse repetition interval (PRI=1/PRF). That is, the sampling interval, or window, is typically in the order of several nanoseconds, while the PRI is in the order of several microseconds.

Two types of charge transfer device input arrangements are sometimes referred to as the "gated input" technique and the "potential equilibration" technique. Such techniques are described in a book entitled *Charge Transfer Devices* by Carlo H. Seguin and Michael F. Tompsett, published by Academic Press, Inc., New York, N.Y., 1975. With the "gated input" technique the potential energy level of the input (or source) diffusion region is controlled by the input signal being sampled (i.e. here the range sweep signal). Just prior to the time a sample of such input signal is to be taken a voltage pulse is applied to an adjacent sampling gate to lower the potential of a "gate" region in the device which is juxtaposed the source diffusion region and thereby allows an amount of charge related to the level of the input signal to pass from the source diffusion region through the gate region to an input region which is juxtaposed the gate region. The level of the charge passed to the gate region is related to the level of the input signal; however, such relationship is nonlinear because the depletion capacitance at the surface of the device is related to the surface potential and hence is related also to the input signal level. Further, such "gated input" technique is relatively noisy because of fluctuations in the partitioning of the charge stored temporarily in the "gate" region during the sampling process.

The potential equilibration technique is used with a charge transfer device which has a source diffusion region, first input gate region and second input gate region disposed, successively, along the charge transfer device. The input signal being sampled is fed to the second input gate region. A reference voltage is fed to the first input gate region to maintain the level of potential energy at the surface of such region at a level greater than the maximum expected level of potential energy at the surface of the second input gate region. The source diffusion region is fed by a pulsed voltage source. Charge is injected by the source diffusion and is shifted into the device at a predetermined clock rate. During each clock interval the potential energy at the source diffusion region is first raised so that the first and second input gate regions are filled with a charge, then lowered so that the charge remaining in the second input gate region is proportional to the difference in voltage between the reference voltage level and the input signal level. The charge remaining in the second input gate region is then shifted to a first storage stage region of the device. During the next clock interval the process repeats. The charge in the first storage stage region is transferred to the next storage stage region during the first half of such clock interval and a new charge is stored in the first storage stage during the second half of such clock interval. The sampling interval, or window, may therefore be considered as the time interval between the time at which the potential energy level of input diffusion region is lowered and the time at which the charge is stored in the first storage stage region. Because the equilibration in charge in the first and second input gate regions always occurs when the surface of the first input region is always at the same potential level, i.e. the reference voltage, the charge stored in the second input gate region is, after equilibration, linearly proportional to the sampled level of the input signal. It should be noted, however, a sampling characteristic of such equilibration technique is that any decrease in input signal level (i.e. rise in potential) between the time at which the input diffusion region potential is lowered and the time the equilibrated charge is stored in the first storage stage region will reduce the amount of actual charge stored in such first input storage stage, the lowest level of such input signal in such time interval thereby being stored in the charge transfer device. In the radar system signal processor application discussed above the clock period would be related to the radar system pulse repetition interval (RPI). In such a processor a plurality of charge transfer devices is included, each one of such devices being used to store samples of a corresponding one of a plurality of range cells. With the equilibration technique described above each device would generally require individual clock pulses and diffusion region voltage pulses, or a buffer stage, to provide the requisite range cell sampling, thereby increasing the cost and complexity of the processor. This is particularly the case when it is desired to form the plurality of charge transfer devices in a single crystal body.

As is also known in the art, a radar system signal processor which employs the use of a plurality of charge transfer devices for storing samples of radar returns, each one of the devices storing samples associated with a corresponding one of a plurality of range cells, also includes an input charge transfer device to distribute the samples of each range sweep into corresponding ones of the plurality of charge storage devices. Where it is desired to form all the charge transfer devices as a single crystal body the input charge transfer device is disposed along a vertical direction and the plurality of range cell storage charge transfer devices is disposed along a horizontal direction, each one of the stages of the input charge transfer device being coupled to a corresponding one of the plurality of charge transfer devices. However, in a practical charge transfer device the width of each device is in the order of 5 mils. Because charge transfer devices generally require very short channel lengths (typically less than 0.4 mils) for high transfer efficiency, with such arrangement a compromise must be made in the dynamic range of the plurality of horizontally disposed devices or the transfer efficiency of the vertically disposed device or both.

SUMMARY OF THE INVENTION

With this background of the invention in mind it is therefore an object of this invention to provide improved input circuitry for a charge transfer device.

It is another object of this invention to provide a charge transfer device signal processor of the aforementioned type wherein each one of the plurality of charge transfer devices and an input signal distributing circuit may be readily formed as a single crystal body.

These and other objects of the invention are attained generally by providing a charge transfer device having a source diffusion region, an isolation gate region, a reference voltage gate region and an input signal gate region disposed contiguously along such device, the source diffusion region being adapted for coupling to a source of charge shifting signals, the isolation gate region being adapted for coupling to a pulse voltage source, the duration of such pulse being related to a predetermined sampling interval (and therefore related to the bandwidth of an input signal being sampled), the reference voltage gate region being adapted for coupling to a reference voltage source and the input signal gate region being adapted for coupling to the input signal. During each clock interval prior to the sampling interval the source diffusion region is pulsed, thereby enabling charge to pass from such region into the reference voltage gate region and the input gate region. During the sampling interval the potential energy level of the isolation gate region is lowered to enable equilibration in energy, or charge, between the charge in the reference voltage source region and the input gate region, the charge in such input gate region thereby being proportional to the input signal level during the sampling interval. At the end of the sampling interval the potential energy level of the isolation gate region is raised to isolate the source diffusion region from the input gate region and thereby inhibit charge flow from the input gate region to the source diffusion region if the input signal level varies prior to the time at which the charge in the input gate region is transferred to the first storage stage of the device.

In a radar system signal processor application a plurality of such charge transfer devices has its source diffusion regions connected to a common bus fed by a pulsed voltage source which pulses such bus at the radar system PRI and is the rate at which charges are transferred from stage to stage through the devices. In this way, in response to each transmitted pulse, charge is "filled" into the isolation gate, reference voltage gate and input signal gate regions of all the charge transfer devices. The reference voltage gate regions are connected to a bus which has coupled thereto the reference voltage source. The input gate regions of such devices are connected to a bus which is fed by the input signal being sampled, i.e. the video signal or range sweep signal. Each charge transfer device has its isolation gate region pulsed with a signal having a pulse width related to the bandwidth of the input signal, that is a pulse width in the order of several nanoseconds. Each charge transfer device is associated with a different one of a number of range cells and therefore each one of the isolation gate regions is pulsed at a correspondingly different time after each radar pulse is transmitted. In particular, a serial shift register sequentially addresses each one of the devices to sequentially sample the return in a corresponding one of the range cells. That is, each stage of the shift register is fed to the isolation gate region of a corresponding one of the charge transfer devices and controls the distribution of input signal samples to each one of the charge transfer devices. That is, a control bit stored in the shift register addresses a charge transfer device, the devices being sequentially addressed as the control bit passes from stage to stage in the register.

BRIEF DESCRIPTION OF THE DRAWINGS

Other objects and many of the attendant advantages of the invention will be readily appreciated as the same becomes better understood by reference to the following detailed description when considered in connection with the accompanying drawings:

FIGS. 3A–3D are timing diagrams useful in understanding the operation of input circuitry used with charge coupled devices included in the memory section shown in FIG. 2;

FIGS. 4A–4I are diagrams useful in understanding the operation of input circuitry used with charge coupled devices included with memory section shown in FIG. 2;

FIGS. 9A-9D are timing diagrams useful in understanding the operation of an alternative embodiment of input circuitry used with the charge coupled devices included in the memory section as shown in FIG. 2; and FIGS. 10A-10I are timing diagrams useful in understanding the operation of an alternative embodiment of input circuitry used with the charge coupled devices included in the memory section as shown in FIG. 2.

DESCRIPTION OF THE PREFERRED EMBODIMENTS

General

Figure 1:
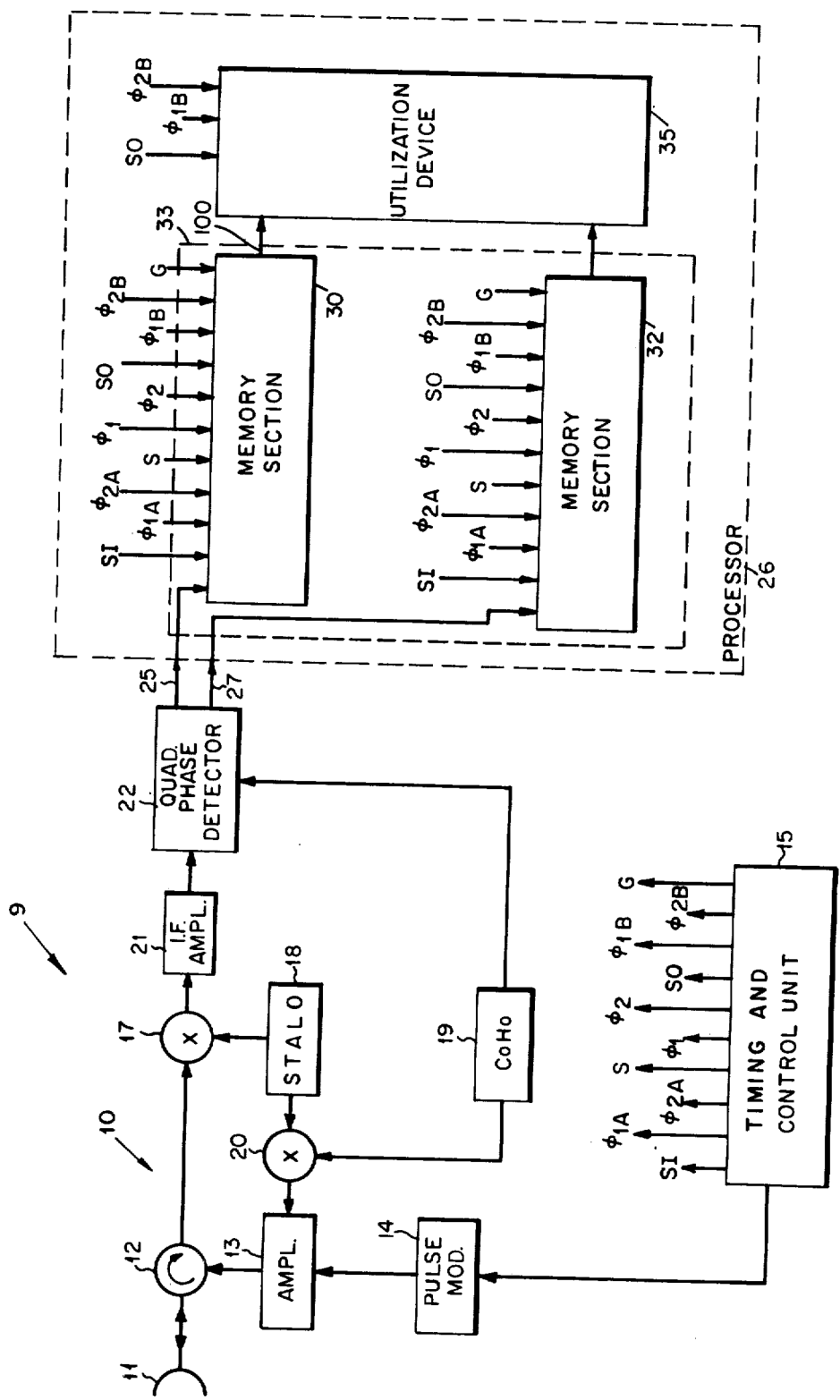
FIG. 1 is a block diagram of a radar system including a signal processor according to the invention.

Referring now to FIG. 1, a coherent Doppler radar system 9 is shown. The radar transmitter/receiver system 10 of such radar system 9 includes an antenna 11 coupled through a circulator 12 to an amplifier, here a klystron amplifier 13, a pulse modulator 14 and a timing and control unit 15 arranged in a conventional manner whereby a train of pulses of radio frequency (RF) energy is transmitted at a desired pulse repetition frequency (PRF), here 10 KHz. Each one of the pulses in the train of transmitted pulses is reflected by various objects which are dispersed over various ranges from the antenna 11. A portion of the reflected energy produced in response to each transmitted pulse is received by antenna 11. The time at which a portion of such energy is received relative to the time at which the transmitted pulse associated therewith is transmitted corresponds to the range of the object causing such portion of the received energy. The energy received by the antenna 11 passes through circulator 12. The signal at the output of circulator 12 is heterodyned in a conventional manner, via mixer 17, with a signal produced by stable local oscillator (STALO) 18. The signal produced by STALO 18 is heterodyned with a signal produced by a coherent local oscillator (COHO) 19 in a mixer 20 to produce a signal which is amplified by klystron amplifier 13 in a conventional manner. The signal produced at the output of mixer 17 is passed through IF amplifier 21 to a conventional quadrature detector 22. Quadrature phase detector 22 responds in a conventional manner to the signals fed thereto from the IF amplifier 21 and a reference signal supplied by the COHO 19 to produce a pair of video signals on lines 25, 27, generally referred to as the "in phase" video signal and the "quadrature" video signal, respectively. The "in phase" and "quadrature" video signals are therefore representative of the phase shift of the received signals after being heterodyned to intermediate frequency signals by mixer 17 and the reference signal produced by the COHO 19 as described in U.S. Pat. No. 3,950,750, "Radar System Having Quadrature Phase Detector Compensator", issued Apr. 13, 1976, inventors Churchill et al, and assigned to the same assignee as the present invention. The rate of change in the levels of the "in phase" and "quadrature" video signals at any selected time after a pulse is transmitted varies from pulse to pulse at a frequency related to the Doppler velocity of an object at the range corresponding to the selected time. The "in phase" and "quadrature" video signals are fed to a processor 26, the details of which will be described. Suffice it to say here that such signal processor 26 is used to determine the Doppler velocity of various objects illuminated by the radar. Briefly, the signal processor 26 includes two identically constructed memory sections 30, 32 formed on a single crystal substrate, here silicon substrate 33, section 30 being fed by the "in phase" video signal (line 25) and section 32 being fed by the "quadrature" video signal (line 27) as indicated. The memory sections 30, 32 will be discussed in detail in connection with FIG. 2; suffice it to say here that each one thereof includes a plurality of, here eight, charge coupled devices, each one thereof being associated with a different one of eight range cells. Each one of the charge coupled devices has a plurality of sixty-four storage stages, the number of storage stages being selected in accordance with the Doppler frequency resolution desired. In response to each transmitted pulse the "in phase" and "quadrature" video signals on lines 25, 27 are sampled at, here eight, selected times after each pulse is transmitted corresponding to the eight range cells. Such eight samples are stored as charges in the first storage stage of a corresponding one of the eight charge coupled devices. After a plurality of, here sixty-four, pulses have been transmitted each charge coupled device stores sixty-four samples of the video signals, such samples being associated with an object at a particular one of eight range cells. The charges stored in the eight charge coupled devices in the memory sections 30, 32 are then passed sequentially to a utilization device 35. That is, first the sixty-four samples stored in a first one of the charge coupled devices and associated with an object at a first range cell are fed as a set of signals to the utilization device 35, then the sixty-four samples stored in a second charge coupled device and associated with a second range cell are fed as a second set of signals to the utilization device 35 and so forth until the sixty-four samples stored in the eighth charge coupled device and associated with the eighth range cell are fed as the eighth set of signals to the utilization device 35. Therefore, memory sections 30, 32 may be considered as storing samples from eight range cells over sixty-four range sweeps and passing to utilization device 35 eight sets of signals, each one of the sets being made up of sixty-four samples of video signals corresponding to an object at a particular range cell. The frequency spectrum of each one of the eight sets of signals (both from memory section 30 and memory section 32) provides a determination of the Doppler velocity of an object at a range cell corresponding to such one of the sets of signals. That is, the rate of change in level of the sixty-four samples in each one of the eight sets of signals is related to the Doppler velocity of an object in the range cell corresponding to such set of signals. Utilization device 35 may be of any conventional design and includes a conventional frequency spectrum analyzer, such as a bank of filters and a conventional display (not shown) as described in U.S. Pat. No. 3,879,661 entitled "Signal Processor and Subassemblies Therefor", inventor John D. Collins, issued Apr. 22, 1975 and assigned to the same assignee as the present invention.

Memory Section

Figure 2:
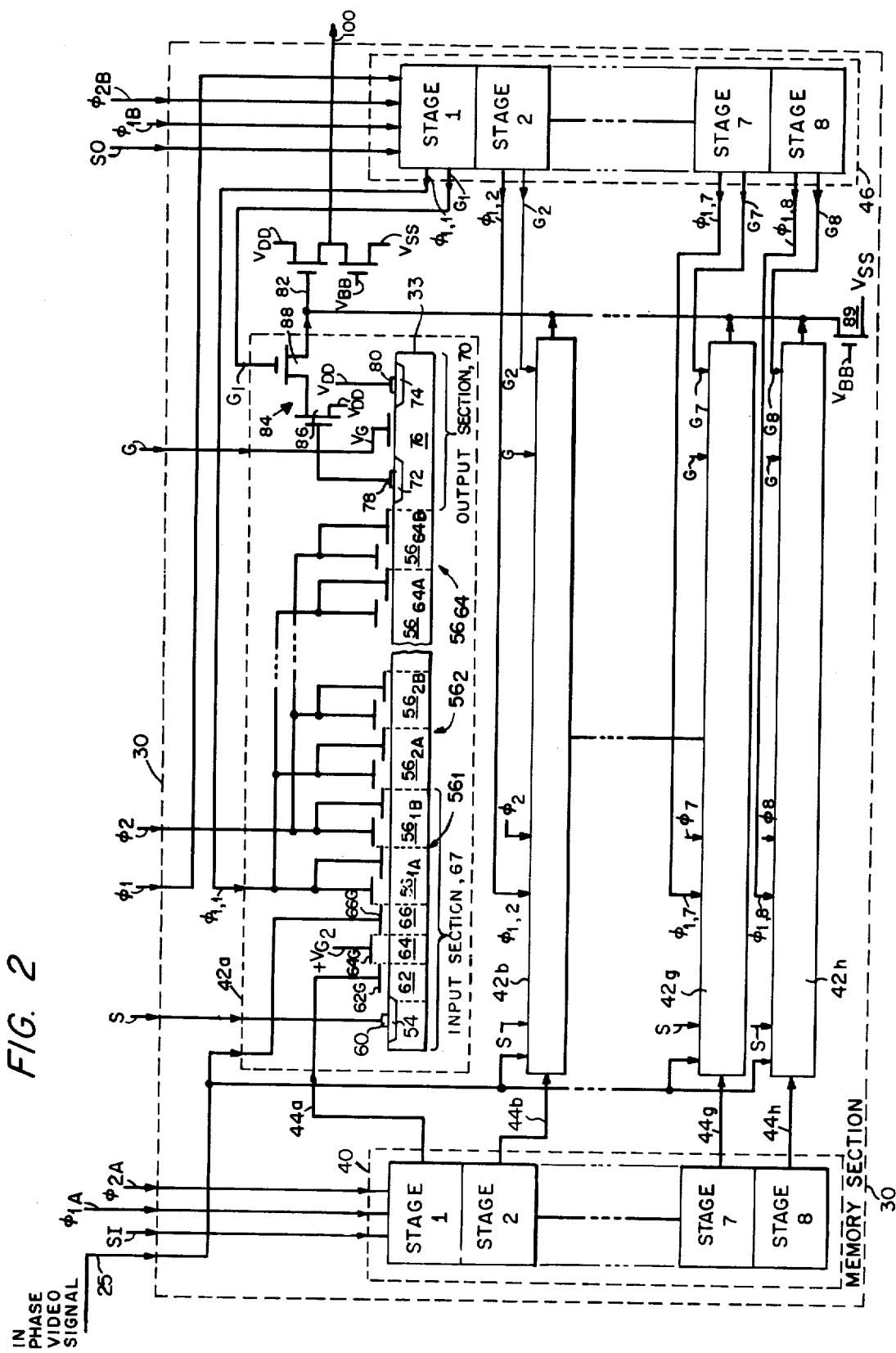
FIG. 2 is a block diagram of a memory section used in the signal processor as shown in FIG. 1.

Referring now to FIG. 2, an exemplary one of the memory sections 30, 32, here memory section 30, is shown in detail to include: A input shift register section 40, here an eight stage shift register, the details of which will be discussed in connection with FIG. 5; a plurality of, here eight, charge coupled devices 42a-42h, each one being coupled to a corresponding one of the eight stages of the input shift register section 40 via lines 44a-44h, as indicated, and to the "in phase" video signal on line 25, as indicated; and an output shift register section 46, here an eight stage shift register, the details of which will be discussed in connection with FIG. 8, each stage of such output shift register section 46 being coupled to a corresponding one of the eight charge coupled devices 42a–42h via eight pairs of lines, $\phi_{1,1}$, $G_1$; $\phi_{1,2}$, $G_2$; - - - $\phi_{1,7}$, $G_7$ and $\phi_{1,8}$, $G_8$, as indicated.

Each one of the plurality of charge coupled devices 42a–42h is identical in construction. An exemplary one thereof, here charge coupled device 42a, is shown formed on the silicon substrate 33, here of P type conductivity, an n+ type conductivity region, here a source or input diffusion region 54, is formed in the substrate 33 using any conventional process. An oxide layer, not shown, is formed over the substrate 33 and electrodes are formed over such oxide layer as indicated, using any conventional process. The charge coupled device 42a includes a plurality of, here sixty-four, storage stages $56_1$–$56_{64}$, each one including two sections: $56_{1A}$, $56_{1B}$; $56_{2A}$, $56_{2B}$ ... $56_{64A}$, $56_{64B}$, as indicated. The electrodes controlling the surface potentials of sections $56_{1A}$, $56_{2A}$, $56_{3A}$ ... $56_{64A}$ are coupled to lines $\phi_{1,1}$ and the electrodes which control the surface potentials of sections $56_{1B}$, $56_{2B}$, $56_{3B}$ ... $56_{64B}$ are coupled to line $\phi_2$. (It is noted that lines $\phi_{1,2}$ ... $\phi_{1,8}$ of charge coupled devices 42b–42h are equivalent to line $\phi_{1,1}$ of charge coupled device 42a; however, lines $\phi_{1,2}$ ... $\phi_{1,8}$ are fed by stages 2–8, respectively, of output shift register section 46 and line $\phi_{1,1}$ is fed by stage 1 of such output shift register section 46 for reasons to become apparent.) An electrode 60, in ohmic contact with the source diffusion region 54, is fed to line S, such line S being coupled to the timing and control unit 15 (FIG. 1). An isolation gate region 62 is contiguous to both the source diffusion region 54 and a reference potential region 64, as shown. The surface potential of the isolation gate region 62 is controlled by the voltage supplied to the isolation gate region electrode 62G via line 44a. (Likewise, it should be noted that the isolation gate regions of charge coupled devices 42b–42h are controlled by signals supplied to lines 44b–44h, respectively.) The surface potential of the reference potential region 64 is controlled by a $+V_{G2}$ reference voltage coupled to reference potential gate electrode 64G. Contiguous to both the reference potential region 64 and the first storage $56_1$ is an input signal region 66, the surface potential of such region 66 being controlled by the level of the "in phase" video signal fed to the input signal gate electrode 66G via line 25. The source diffusion region 54, isolation gate region 62, reference potential region 64, input signal region 66 and first storage stage $56_1$ may be considered as the input section 67 of the charge coupled device 42a and the operation of such section 67 will be discussed in connection with FIGS. 3 and 4. An output section 70 of such charge coupled device 42a includes an output diffusion region 72 of N+ type conductivity, a drain diffusion region 74 of N+ type conductivity, and a gate region 76, all formed in a conventional manner, electrodes 78, 80 being in ohmic contact with regions 72, 74, respectively. Electrode 80 is coupled to a fixed voltage source $V_{DD}$. Gate electrode $V_G$, which controls the surface potential of the gate region 76, is coupled to the timing and control unit 15 (FIG. 1) via line G. The electrode 78 is coupled to output bus 82 via a switch 84. Switch 84 includes a pair of FET's 86, 88. Also connected to bus 82 is the drain electrode of FET 89. The gate of such FET 89 is connected to a voltage source $V_{BB}$ and the source electrode is connected to a voltage source $V_{SS}$. The gate electrode FET 86 is connected to electrode 78, the drain electrode of FET 86 is coupled to the $+V_{DD}$ voltage source and the source electrode of FET 86 is connected to the drain electrode of FET 88, as shown. The source electrode of FET 88 is coupled to bus 82. The gate electrode of FET 88 is coupled to the first stage of the output shift register section 46 via line $G_1$. (It is noted that lines $G_2$–$G_8$ are equivalent to line $G_1$; however, lines $G_2$–$G_8$ are coupled to stages 2–8, respectively, of output register section 46 and line $G_1$ is coupled to the first stage of such section 46, as indicated.)

The operation of the input section 67 of charge coupled device 42a will be discussed in connection with FIGS. 3A–3D and FIGS. 4A–4I. As shown in FIGS. 3A, at a time $t_0$ a radar pulse 92 is transmitted by the radar system and in response to reflections of such transmitted pulse from various objects disposed at different ranges from such radar system the "in phase" video signal 94 is produced on line 25. At time $t_1$ the surface potentials of the various regions making up input section 67 (FIG. 4A) are as shown in FIG. 4B. At a predetermined time after the radar pulse 92 is transmitted timing and control unit 15 (FIG. 1) produces a pulse 96 on line S as shown in FIG. 3B. It should be noted that the pulse on line S is fed to all charge coupled devices, 42a–42h (FIG. 2). The surface potentials of the regions of the input section 67 at time $t_2$ (during the pulse 96) are shown in FIG. 4C. The effect of the pulse 96 is to enable charge in the input diffusion region 54 to saturate the isolation gate region 62, the reference potential region 64 and the input signal region 66 (for all charge coupled devices 42a–42h, (FIG. 2), as indicated in FIG. 4C. After the pulse 96 is removed the surface potentials of the regions in the input section 67 at times $t_3$ and $t_4$ are as shown in FIGS. 4D and 4E, respectively. As shown, the potentials of the surfaces of regions 64, 66 equilibrate to the surface potential of the isolation gate region 62. At a predetermined time after the radar pulse 92 is transmitted, i.e. when the first range cell of the "in phase" video signal is to be sampled a logical 1 becomes stored in the first stage of the input shift register section 40 and a pulse 98 is coupled to line 44a as shown in FIG. 3C. As will become apparent, the pulse 98 serves as the range cell sampling pulse of the "in phase" video signal. The pulse 98 on line 44a lowers the surface potential of the isolation gate region 62 as indicated at time $t_5$ in FIG. 4F. Therefore, an equilibration occurs between the surface potentials of the reference potential region 64 and the input signal region 66. Such regions 64, 66 may be considered as an equilibration region. That is, the charge stored in the input signal region 66 is proportional to the level of the "in phase" video signal on line 25. When the pulse 98 is removed the charge which was stored in the input signal region 66 becomes distributed between the reference potential region 64 and the input signal region 66 as indicated at times $t_6$ and $t_7$ in FIGS. 4G and 4H, respectively, as the level of the "in phase" signal changes. It is noted, however, that the surface potential of the isolation gate region 62 is sufficiently low to prevent charge flow across the isolation gate region 62 back into the source diffusion region 54. A clock pulse is applied to line $\phi_{1,1}$ by the output shift register section 46 to enable the charge stored in the input signal region 66 at the time of the application of pulse 98 to become stored in the first storage stage $56_1$. The surface potentials of the regions of the input section 67 at time $t_8$ are shown in FIG. 4I. In view of the foregoing it is noted that the pulse 98 on line 44a serves as the range gate for the first range cell because the charge stored in the first storage stage $56_1$ of charge coupled device 42a is proportional to the level of the "in phase" video signal 94 at the time of the pulse 98.

Referring again also to FIG. 2, in response to clock signals on lines $\phi_{1A}$, $\phi_{2A}$ from timing and control unit 15 (FIG. 1) the logical 1 in the first stage of input shift register section 40 shifts to the second stage thereof and a pulse appears on line 44b. The pulse on line 44b serves as the range gate for the second sample. The logical 1 passes from stage to stage as described so that a sequence of pulses is applied to lines 44c-44h to provide the third through eighth range gates. Consequently, after the first transmitted pulse eight range cell samples are stored in the first storage stage of charge coupled devices 42a-42h, respectively.

Charges stored in the storage stages $56_1$-$56_{64}$ are shifted from stage to stage in response to two phase clock signals on lines $\phi_1$, $\phi_2$. It is noted, for reasons to become apparent in connection with FIG. 7, during the period of time in which samples are stored into the charge coupled devices 42a-42h, the clock pulses on line $\phi_1$ are fed to all the lines $\phi_{1,1}$-$\phi_{1,8}$ via the output shift register section 46. That is, the clock pulses on lines $\phi_1$, $\phi_2$ have a clock period equal to the radar pulse repetition interval and such clock pulses are applied to all charge coupled devices 42a-42h during the time samples being stored in such devices. Therefore, each one of the charge coupled devices 42a-42h initially stores and then shifts said charge simultaneously during the input operation of the processor 26 (FIG. 1).

To put it another way, after a pulse is applied to line 44h a clock pulse is applied to lines $\phi_{1,1}$-$\phi_{1,8}$ and line $\phi_2$ to enable simultaneous storage of each of the samples in the first storage stages of charge coupled devices 42a-42h. Next a second radar pulse is transmitted and at the proper times: a pulse is applied to line S; a logical 1 becomes stored in stage 1 of the input shift register section 40 and then shifted from stage to stage to produce pulses on lines 44a-44h, such pulses on lines 44a-44h being produced during the time interval between time $t_5$ and time $t_7$ (FIGS. 3A-3D); and at the time $t_8$ all eight range cell samples are stored simultaneously in the first storage stages of charged coupled devices 42a-42h as the range cell samples of the first range sweep are shifted simultaneously to the second storage stages of charge coupled devices 42a-42h. The process repeats until sixty-four samples of each one of the eight range cells are stored in the charge coupled devices 42a-42h.

During the reading operation of the processor 26 (FIG. 1), after storage of the sixty-four samples for each of the eight range cells all storage stages of the output register section 46 are reset to a logical 0 state. Next a logical 1 becomes stored in the first stage of output register section 46 thereby producing a high signal on line $G_1$ and enabling clock pulses on line $\phi_1$ to pass only to line $\phi_{1,1}$ in a manner to be discussed in connection with FIG. 8. Suffice it to say here that during the "read out" phase of charge coupled device 42a clock pulses are fed to lines $\phi_{1,1}$ and $\phi_2$ (but not to lines $\phi_{1,2}$-$\phi_{1,8}$) to shift the stored charge through enabled switch 84 to bus 82. After sixty-four clock pulses have transferred all sixty-four charges to bus 82 the logical 1 stored in the first stage of output shift register section 46 becomes shifted to the second stage in response to signals on lines $\phi_{1B}$, $\phi_{2B}$. In response to a logical 1 stored in the second stage, clock pulses on line $\phi_1$ become coupled to line $\phi_{1,2}$ (and inhibited from lines $\phi_{1,1}$ and $G_1$ and $\phi_{1,3}$-$\phi_{1,8}$ and $G_3$-$G_8$) thereby to enable the sixty-four samples stored in charge coupled device 42b to pass to bus 82. The process then repeats as the "logical 1" passes through stages 3-8. In this way eight sets of sixty-four samples are serially fed to line 82 and hence to utilization device 35 (FIG. 1) via line 100. It is noted that pulses are applied to line G by the timing and control unit 15 just prior to coupling a sample to switch 84 from region $56_{64b}$ to sweep away charge in the source region 72.

Input Shift Register Section

Figure 5:
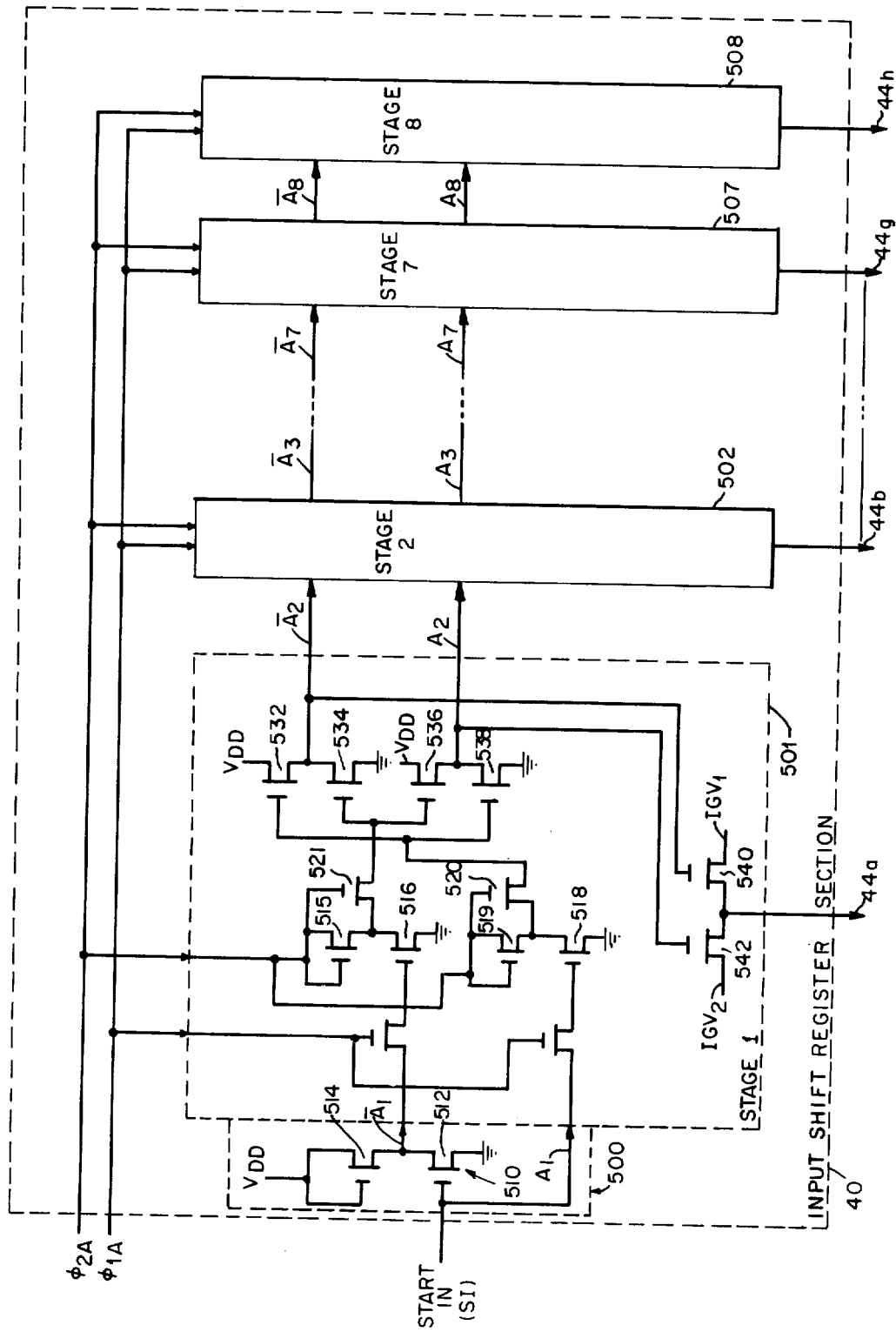
FIG. 5 is a block diagram of an input shift register section used in the memory section shown in FIG. 2.

Referring now to FIG. 5, input shift register section 40 is shown to include an input section 500 and eight serially coupled storage stages 501-508, as indicated. Input section 500 includes an inverter 510 made up of an FET 512 and FET 514. FET 512 has its gate electrode coupled to the timing and control unit 15 (FIG. 1) via line SI. The source electrode of FET 512 is coupled to ground and the drain electrode is coupled to: (1) the $V_{DD}$ voltage supply through FET 514, as shown; and (2) line $\overline{A}_1$. Line SI also serves as line $A_1$. That is, "true" and "complement" signals are produced on lines $A_1$ and $\overline{A}_1$, respectively. Each one of the storage stages 501-508 is identical in construction. An exemplary one thereof, here stage 501, is shown to include two sections, the first section enabling data on lines $\overline{A}_1$ and $A_1$ to become stored as charge in the gate regions of FET's 516, 518 in response to a high clock pulse signal on line $\phi_{1A}$ and the second section enabling the data stored in the first section to be transferred and stored in the gate regions of FET's 532, 534, 536, 538 in response to a high signal on line $\phi_{2A}$. The signals on lines $\phi_{1A}$, $\phi_{2A}$ are produced by the timing and control unit 15 (FIG. 1) in a conventional manner. That is, the input shift register section 40 may be considered as a two phase dynamic FET shift register wherein data is transferred from stage-to-stage in response to a clock pulse on line $\phi_{1A}$ followed by a clock pulse on line $\phi_{2A}$.

Figure 6:
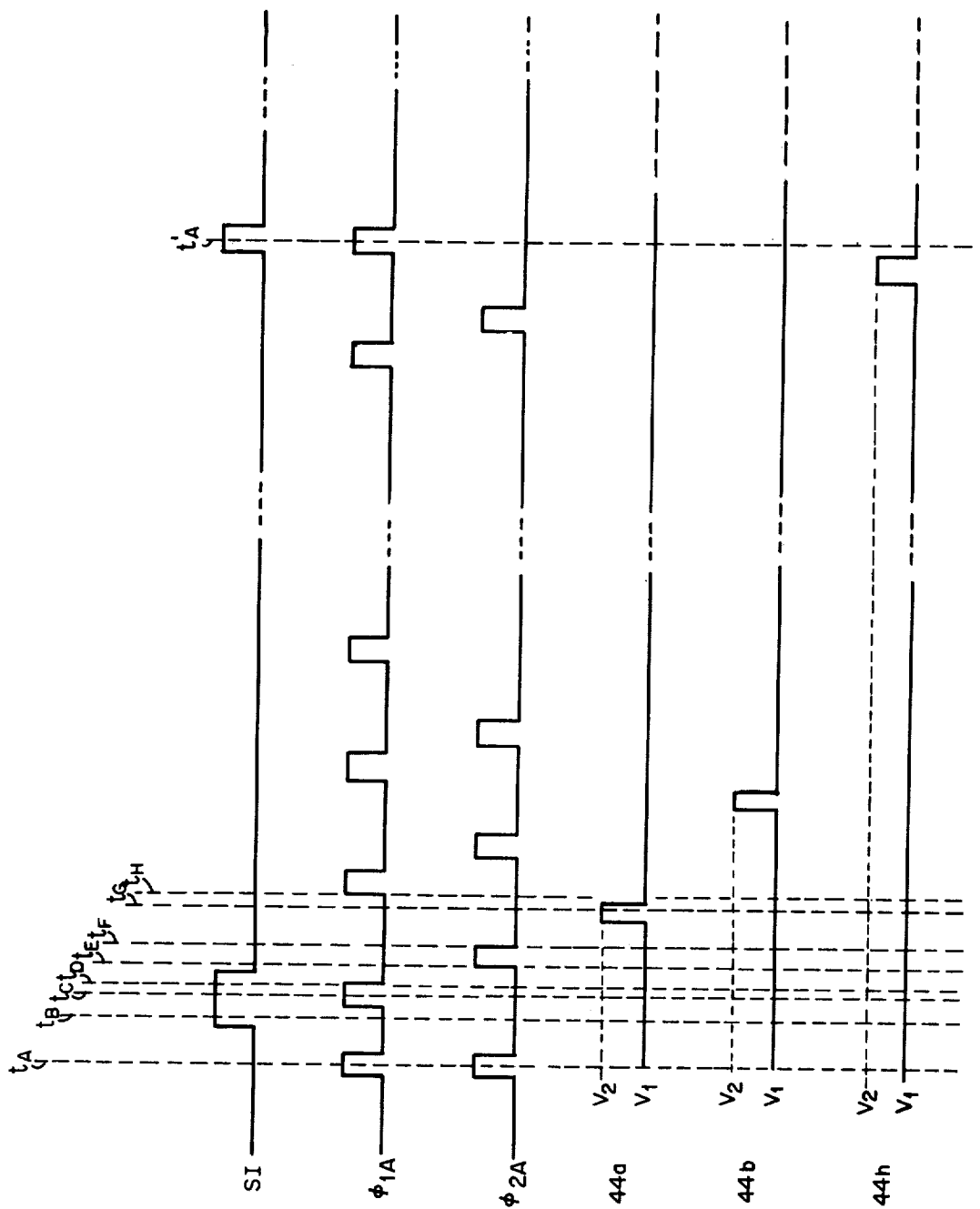
FIG. 6 is a timing diagram useful in understanding the operation of the input shift register section shown in FIG. 5.

In operation, and referring also to FIG. 6, to reset all storage stages 501-508, that is to store a logical 0 in all such stages and couple a low voltage source (here $IGV_1$ volts) to lines 44a-44h, line SI is made "low" and lines $\phi_{1A}$, $\phi_{2A}$ are made high at time $t_A$ thereby to produce high signals on lines $\overline{A}_1$-$\overline{A}_8$ and low signals on lines $A_1$-$A_8$ whereby an $IGV_1$ voltage source is coupled to line 44a through FET 540, such reset condition being shown in FIG. 6 at time $t_A$.

In order to store a logical 1 in the storage stage 501 thereby to couple a pulsed voltage source $IGV_2$ to line 44a, line SI is made high, as at time $t_B$, causing line $\overline{A}_1$ to go low and line $A_1$ to go high. A high signal (or clock pulse) is applied to line $\phi_{1A}$ (at time $t_C$) thereby causing lines $\overline{A}_1$ and $A_1$ to become electrically coupled to the gate electrodes of FET's 516, 518. Line $\phi_{1A}$ goes low (at time $t_D$) and thereafter line $A_1$ can go low since when line $\phi_{1A}$ goes low it electrically decouples the gate electrodes of FET's 516, 518 from lines $\overline{A}_1$, $A_1$; however, charge is stored in the gate regions of such FET's 516, 518 indicative of a low signal on line $\overline{A}_1$ and a high signal on line $A_1$. Next, line $\phi_{2A}$ goes high (time $t_E$), activating FET's 515, 521, 519 and 520. FET's 515 and 519 act as load resistors for the precharged FET's 516 and 518 which act as inverter devices. FET's 521 and 520 act as switches and couple the signals on lines $A_1$ and $\overline{A}_1$ to output drivers which include FET's 532, 534, 536 and 538. The output drivers reinvert the coupled signals and pass them as signals on lines $A_2$ and $\overline{A}_2$ (for the next stage 502). Line $\phi_{2A}$ then goes low at time $t_F$ thereby turning off FET's 515, 521, 519 and 520. When line $\phi_{2A}$ goes low it electrically decouples the inputs from the output devices (FET's 532, 534, 536 and 538); however, charge is stored in the gate regions of the output drivers and they continue to sustain signals on lines $A_2$ and $\overline{A}_2$ until the next sequence of $\phi_{1A}$ and $\phi_{2A}$ pulses transfer the signals on lines $A_2$ and $\overline{A}_2$ into the second stage 502. Since the signals on lines $A_2$, $\overline{A}_2$ are coupled to FET's 542 and 540, respectively, as shown, such transferred data causes coupling of the $IGV_2$ voltage source to line 44a via FET 542 while the $IGV_1$ voltage source becomes decoupled from line 44a. (It is noted that the storage stage 1 includes, in effect, two serially coupled inverters, and, after a full two phase clock interval, the signals on lines $A_1$ and $\overline{A}_1$ are transferred to appear as signals on lines $A_2$, $\overline{A}_2$).

To transfer the logical 1 stored in storage stage 501 to storage stage 502 line $\phi_{1A}$ goes high (time $t_H$) to enable the data on lines $A_2$, $\overline{A}_2$ to become transferred to the first section of storage stage 502. Further, it is noted that line SI is low so that during subsequent clock pulses on lines $\phi_{1A}$, $\phi_{2A}$ storage stage 501 continues to store a logical 0 because line $\overline{A}_2$ goes high, thereby coupling voltage source $IGV_1$ to line 44a. Thus, the logical 1 stored in storage stage 501 shifts to storage stage 502 (time $t_H$) and then from stage to stage in response to each set of two phase clock pulses in a like manner. The process repeats at time $t'_A$.

It is noted that the voltage source $IGV_1$ is a constant, low voltage source having a level $V_1$ throughout the operating cycle whereas the voltage source $IGV_2$ is a voltage source which produces a pulse operating between the voltage levels $V_1$ and $V_2$. Further, the input shift register section 40 may be considered as a means for sequentially addressing each one of the charge coupled devices 42a–42h (FIG. 1) (via the isolation gate region 62) as the logical 1 shifts from storage stage 501 to 508, respectively. The voltage source $IGV_1$ will be connected, via FET 540, to the nonaddressed isolation gate regions. However, when the isolation gate region of one of the charge coupled devices 42a–42h is "addressed", the $IGV_2$ voltage source will be connected to such region, allowing it to be pulsed between the $V_1$ and $V_2$ levels at the proper times as shown in FIG. 6.

Output Shift Register Section

Figure 8:
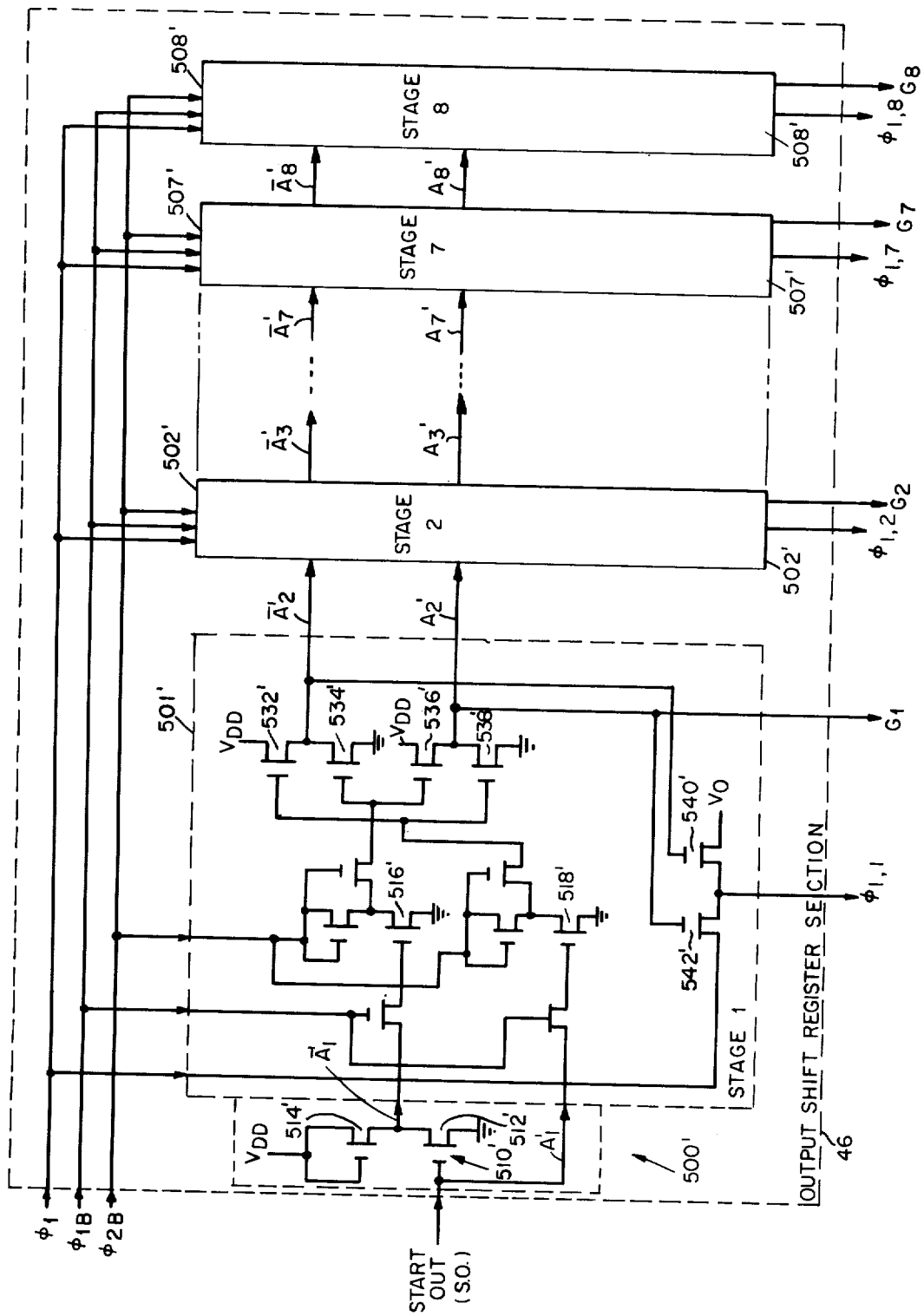
FIG. 8 is a block diagram of an output shift register section used in the memory section shown in FIG. 2.

Referring now to FIG. 8, output shift register section 46 is shown to include an input section 500′ and eight serially coupled storage stages 501′–508′, as indicated. It should be noted that the output shift register section 46 is similar in construction to the input shift register section 40, equivalent components being here shown with a prime in the numerical designation. Here, however, data is shifted from stage to stage in response to clock pulses on lines $\phi_{1B}$, $\phi_{2B}$, such clock pulses being supplied from timing and control unit 15 (FIG. 1). Further, each one of the storage stages 501′–508′ has two output lines: $\phi_{1,1}$, $G_1$; $\phi_{1,2}$, $G_2$; - - $\phi_{1,8}$, $G_8$, as indicated.

In operation, to set all storage stages 501′–508′, that is, to store a logical 1 in all stages and couple line $\phi_1$ to lines $\phi_{1,1}$–$\phi_{1,8}$, line SO is made high and lines $\phi_{1B}$, $\phi_{2B}$ are made high, thereby to produce high signals on lines $A'_1$–$A'_8$ and low signals on lines $\overline{A}'_1$–$\overline{A}'_8$. It is noted that the output shift register section 46 is placed in the set condition when samples of the video signals are being stored in the charge coupled devices 44a–44h (FIG. 1) so that clock pulses on line $\phi_1$ are passed to lines $\phi_{1,1}$–$\phi_{1,8}$ of such charge coupled devices 44a–44h.

When data stored in the first charge coupled device 44a is to be read therefrom, just prior to such reading sequence all storage stages 501′–508′ are first placed in a "reset" condition (i.e. store logical 0's) and then a logical 1 is stored in first storage stage 0 until all sixty-four samples stored therein are read therefrom at which time the logical 1 is shifted to the second storage stage 2 until the sixty-four samples are read therefrom and the logical 1 passes from stage to stage until the sixty-four samples stored in each one of the right range cells of memory 30 (FIG. 2) are read and passed to the utilization device 35. (It is noted that memory 32 operates in like manner and simultaneously with memory 30 so that the "quadrature" signals are also passed as eight sets of sixty-four digital samples to the utilization device 35).

A voltage source, $V_o$, having a level equal to the most positive voltage level of the signal on line $\varphi_1$, is coupled to FET 540′, as shown.

Timing and Control

Figure 7A:
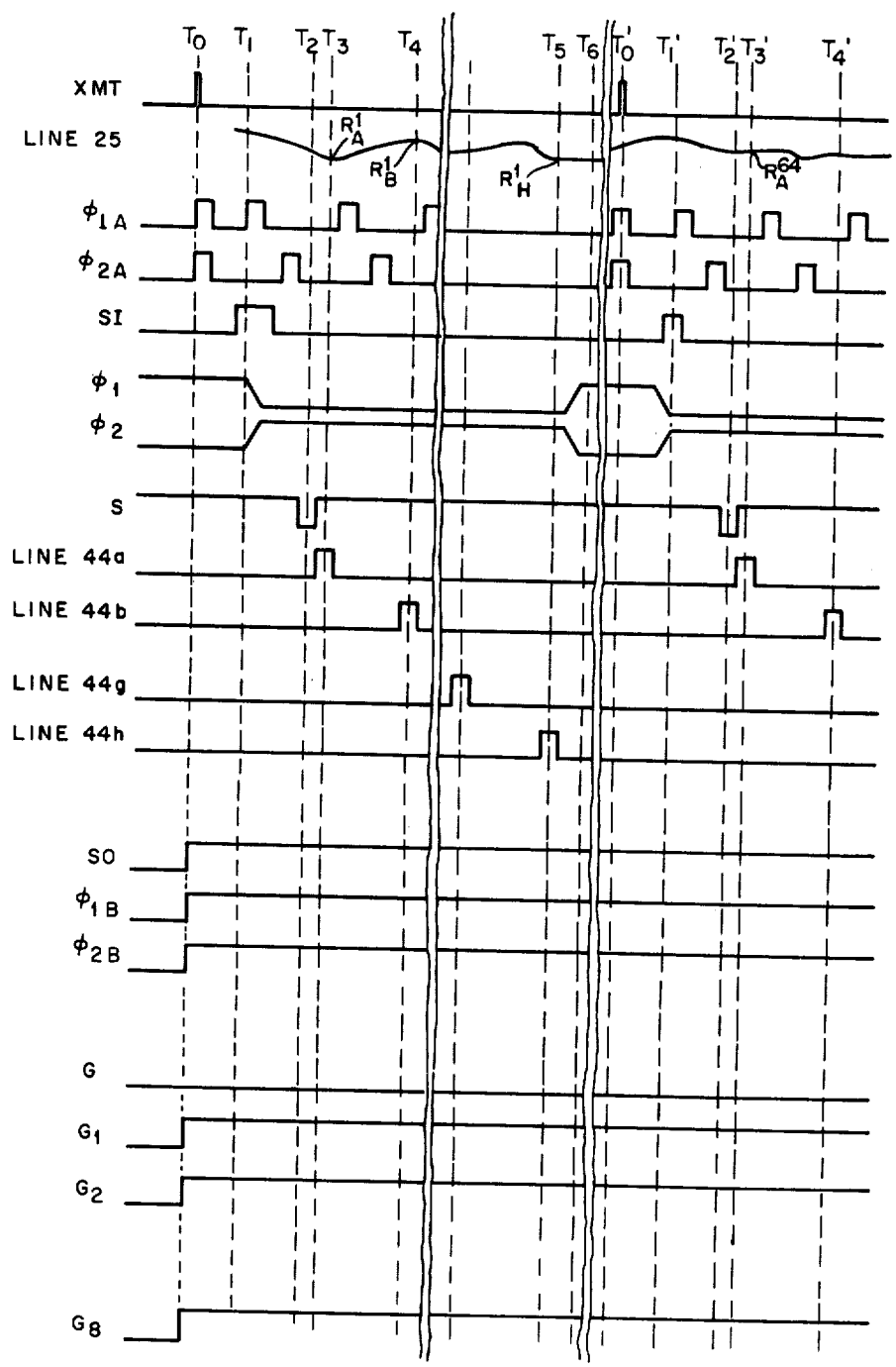
FIG. 7 is a diagram showing the relationship between FIG. 7A and FIG. 7B, such FIGS. 7A and 7B together being a timing diagram useful in understanding the operation of the processor shown in FIG. 1.
Figure 7:
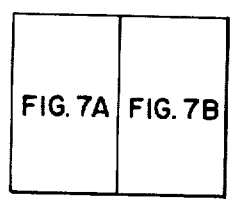
Figure 7B:
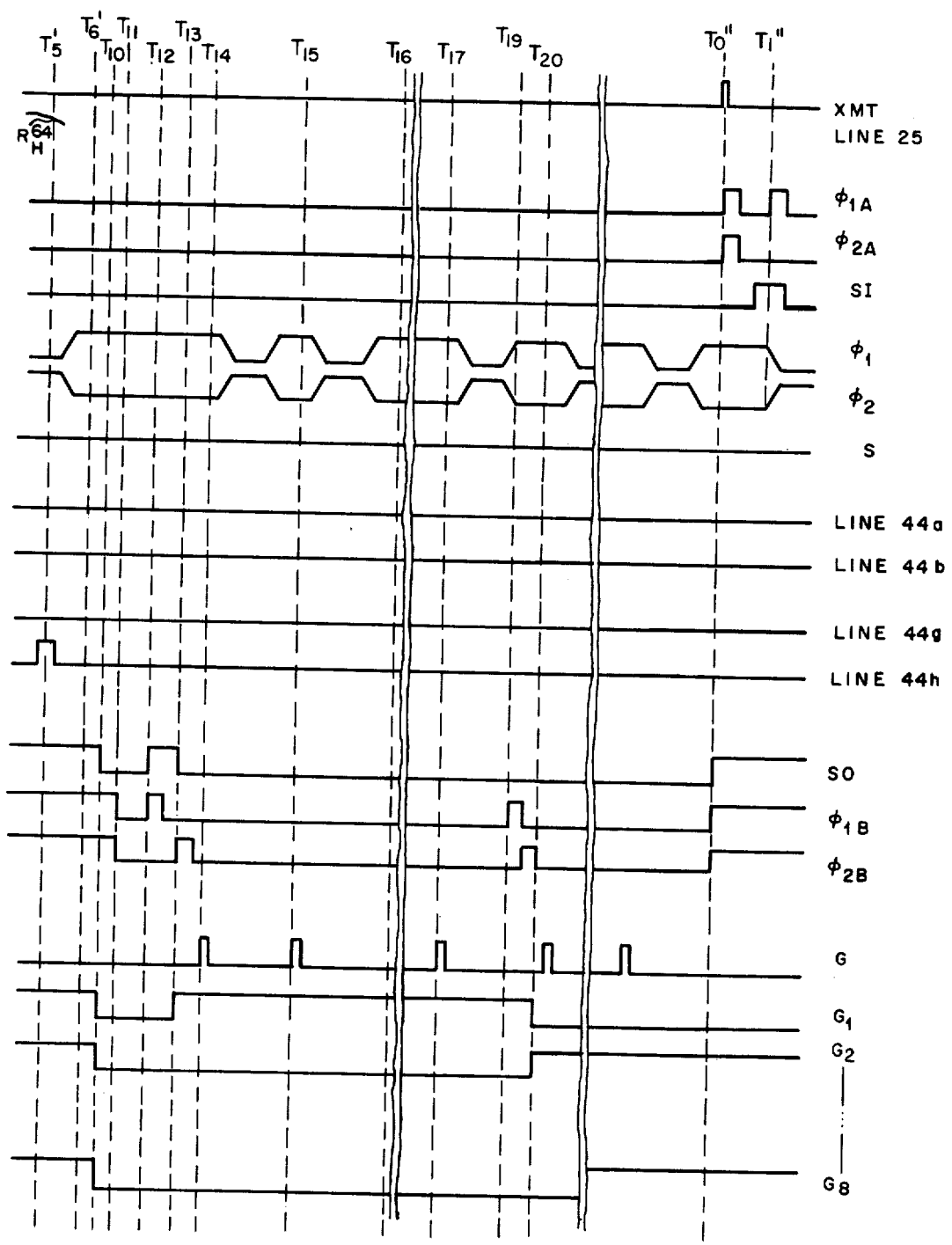

Referring now to FIGS. 7A and 7B (and FIG. 2) at time $T_0$ a pulse is transmitted by the radar system. Between the time $T_0$ and $T_1$ the input shift register section 40 and the output shift register section 46 are placed in reset and set conditions, respectively, by the signals on lines $\phi_{1A}$, $\phi_{2A}$, SI, $\phi_{1B}$, $\phi_{2B}$ and SO in the manner described above. It is noted that during this period clock pulses on line $\phi_1$ pass to lines $\phi_{1,1}$–$\phi_{1,8}$. At time $T_1$ a logical 1 is introduced into the stage 1 of the input shift register section 40 by pulses on lines $\phi_{1A}$, $\phi_{2A}$ and SI. At time $T_2$ a pulse applied to line S enables charge to flow from the input diffusion region 54 into the isolation gate region 62, reference potential region 64 and input signal region 66 as described in connection with FIGS. 3B and 4C. It is noted that the pulse on line S is applied to all eight charge coupled devices 42a–42h. At time $T_3$ a pulse applied to line 44a serves as the first range gate and samples the level ($R_A^1$) of the video signal on line 25 as described in connection with FIG. 3C. In response to a clock pulse on line $\phi_{1A}$ and a clock pulse on line $\phi_{2A}$ after time $T_3$, a second range cell or sample pulse is applied to line 44b (time $T_4$) to sample the level $R_B$. The process repeats until after the eighth range cell pulse is applied to line 44h at time $T_5$ and the sample $R_H$ is obtained. Then in response to a clock pulse on line $\phi_1$ at time $T_6$ (such pulse being applied to lines $\phi_{1,1}$–$\phi_{1,8}$ via output shift register section 46) the eight range gate samples ($R_A^1$–$R_H^1$) are stored in the first storage stages of the eight charge coupled devices 42a–42h, such devices storing the samples $R_A^1$–$R_H^1$, respectively.

The process repeats for sixty-three more transmitted radar pulses, the sequence for the sixty-fourth transmitted pulse being shown at times $T'_0$–$T'_5$. Here video samples $R_A^{64}$–$R_H^{64}$ are taken as indicated and at time $T'_6$ the eight samples $R_A^{64}$–$R_H^{64}$ are stored in the first storage stages of the charge coupled devices 42a–42h, respectively.

It should also be noted that when a sample is stored in the first storage stage $56_1$ the samples previously stored shift to the next storage stage. Therefore, at $T'_6$ charge coupled device 42a has stored in storage stages $56_1$–$56_{64}$ sixty-four samples of the video signal associated with the first range cell (i.e. $R_A^{64}$–$R_A^1$). Likewise, charge coupled devices 42b–42h store in stages $56_1$–$56_{64}$ thereof sixty-four samples associated with the second through eighth range cells, i.e. $R_B{}^{64}-R_B{}^1$, $R_C{}^{64}-R_C{}^1, \ldots R_H{}^{64}-R_H{}^1$).

Between times $T_{10}$ and $T_{11}$ line SO is made low, while lines $\phi_{1B}$ and $\phi_{2B}$ are high to reset the stages 501'–508' of the output shift register section 46 to a logical 0 state as described above. During this time interval lines $G_1-G_8$ go low. Between times $T_{12}-T_{13}$ a logical 1 is stored in the stage 501' of output shift register section 46 and line $G_1$ goes high while lines $G_2-G_8$ remain low. This also enables clock pulses on line $\phi_1$ to pass to line $\phi_{1,1}$ while being decoupled from lines $\phi_{1,2}-\phi_{1,8}$ as discussed above.

It is also noted that at time $T_{14}$ a pulse is applied to line G for reasons discussed with output section 70. Just prior to time $T_{15}$ the first range cell sample $R_A$ is read from the charge coupled device 42a. The $\phi_1$ and $\phi_2$ clock pulses and G reset pulse continue to operate the charge coupled device 42a until all sixty-four video samples $R_A{}^1-R_A{}^{64}$ have been read out, the last sample $R_A{}^{64}$ being read out just before $T_{19}$. After time $T_{19}$ and $\phi_{1B}$ and $\phi_{2B}$ pulses will cause the logical "1" stored in the output shift register 46 to be transferred from stage 501' to stage 502' in a manner described above. At time $T_{20}$ the G2 line will therefore be driven high while the G1 line will be returned to low. The latter occurs since the $\phi_{1B}$, $\phi_{2B}$ clock sequence occurring from $T_{19}$ to $T_{20}$ will transfer the low level from the SO input to the output of stage 501 in a manner already described above.

The charge coupled device 42b, having been addressed by the stage 502' in the manner described above, is not "read" because clock pulse on line $\phi_1$ will be connected to such charge coupled device 42b and the sixty-four video samples $R_B{}^{64}-R_B{}^1$ stored therein will be read out in the equivalent manner as described above for charge coupled device 42a.

The process described above will repeat for charge coupled devices 42c–42h until all 512 video samples from $R_A{}^1$ to $R_H{}^{64}$ have been read out from all charge coupled devices 42a–42h, respectively.

It is to be noted that during all the operations described above for the output shift register section 46 the lines $\phi_{1,1}-\phi_{1,8}$ of nonaddressed charge coupled devices are always connected to a positive voltage level $V_o$ (FIG. 8) by FET 540'. The positive voltage level $V_o$ is equal to the most positive level of $\phi_1$ and $\phi_2$ and will create deep storage wells for the purpose of storing the range samples until each charge coupled device is addressed for retrieval of the stored samples.

It should also be noted that the operations described above for the "in phase" memory section 33 will be carried out simultaneously in the "quadrature" memory section 32 as shown in FIG. 1.

Returning again to FIG. 7B, after the last range sample, $R_H{}^{64}$, is read out just prior to $T''_o$, the entire operating sequence will repeat for the next series of 512 range samples $R_A{}^1$ to $R_H{}^{64}$ as described above.

Referring now to FIGS. 9A–9D and 10A–10I, an alternative embodiment of the invention is shown. The principal difference is that the isolation gate region 62G electrode is pulsed twice and when not being pulsed is held at a lower potential ($V_{L2}$) than the potential ($V_{L1}$) (FIG. 3C). FIG. 10B shows the same condition of the charge transfer device 42a as shown in FIG. 4B. At time $t'_1$ pulses are applied to lines S and 44a, allowing charge to flood the input, isolation and reference regions 66, 64 and 62. Before pulse 96' on line S is removed, the pulse on the isolation gate electrode 62G is removed, as indicated at time $t'_2$. The surface potentials of the charge transfer device 42a at times $t'_2$ and $t'_3$ are shown in FIGS. 10D and 10E, respectively. At time $t'_4$ a second pulse is applied via line 44a and an equilibration occurs between the surface potentials of regions 64 and 66 as shown in FIG. 10F. The response of the surface potentials to subsequent changes in the video signal at times $t'_5$ and $t'_6$ is shown in FIGS. 10G and 10H. At $t'_7$ the charge sample is transferred to the first storage stage 56$_1$ as shown in FIG. 10I.

Having described preferred embodiments of this invention, it is evident that other embodiments incorporating its concepts may be used. For example, the reference voltage gate region and the input signal gate region may be reversed in position. The charge transfer devices may be buried channel devices rather than the surface channel devices described. It is felt, therefore, that this invention should not be restricted to such preferred embodiments but rather should be limited only by the spirit and scope of the appended claims.

What is claimed is:

1. In combination:
   (a) a charge transfer device having a source region, an equilibration region, and an isolation gate region disposed contiguously to the source region and the equilibration region, such equilibration region including a reference gate region and an input signal gate region;
   (b) means for coupling the input signal gate region to an input signal;
   (c) means for coupling the source region to a source of first electrical pulses;
   (d) means for coupling the isolation gate region to a source of second electrical pulses, the time duration of such second electrical pulses being related to the bandwidth of the input signal, each one of such second pulses occurring after a corresponding one of the first electrical pulses; and
   (e) means for coupling the reference gate region to a voltage source.

2. The combination recited in claim 1 including additionally a storage stage region and means for coupling such storage stage region to a source of third electrical pulses, each one of such pulses occurring subsequent to a corresponding one of the second electrical pulses.

3. In combination:
   (a) a charge transfer device having a source region, an isolation gate region, and an equilibration region, such equilibration region including a reference gate region and an input signal gate region;
   (b) means for filling the equilibration region with charge from the source region;
   (c) means, operative subsequently to the filling means, for enabling the charge in the equilibration region to equilibrate excess charge flowing back into the source region, the charge remaining in the equilibration region being related to the input signal during operation of such enabling means;
   (d) means, operative subsequent to the enabling means, for isolating the source region from the equilibration region, preventing further flow of charge from the equilibration region to the source region; and
   (e) means operative subsequent to the isolating means for enabling the charge in the equilibration region to be stored in a storage stage of the charge transfer device.

4. A method for introducing charge into a charge transfer device comprising the steps of:
 (a) pulsing a source region of the device to fill an equilibration region of the device with a pulse of charge from the source region device at a first predetermined time;
 (b) subsequently enabling charge in the equilibration region to equilibrate, excess charge flowing back into the source region, the charge remaining in the equilibration region being related to an input signal;
 (c) subsequently isolating the source region from the equilibration region after equilibration, preventing further flow of charge from the equilibration region to the source region with variations in the input signal; and
 (d) subsequently enabling charge isolated in the equilibration region to be stored in a storage stage of the device.

* * * * *